US012592288B2

(12) United States Patent
Nigam et al.

(10) Patent No.: US 12,592,288 B2
(45) Date of Patent: Mar. 31, 2026

(54) DATA STORAGE DEVICE AND METHOD FOR MANAGING A HOT COUNT DIFFERENCE IN SUB-BLOCK MODE

(71) Applicant: Sandisk Technologies, Inc., Milpitas, CA (US)

(72) Inventors: Akash Nigam, Bangalore (IN); Manoj M. Shenoy, Bangalore (IN); Lakshmi Sowjanya Sunkavelli, Kochi (IN)

(73) Assignee: Sandisk Technologies, Inc., Milpitas, CA (US)

( * ) Notice: Subject to any disclaimer, the term of this patent is extended or adjusted under 35 U.S.C. 154(b) by 236 days.

(21) Appl. No.: 18/586,943

(22) Filed: Feb. 26, 2024

(65) Prior Publication Data

US 2025/0273278 A1     Aug. 28, 2025

(51) Int. Cl.
 *G11C 16/34*     (2006.01)
 *G11C 16/10*     (2006.01)
(52) U.S. Cl.
 CPC ........ *G11C 16/3427* (2013.01); *G11C 16/102* (2013.01); *G11C 16/3495* (2013.01)
(58) Field of Classification Search
 CPC .............. G11C 16/3427; G11C 16/102; G11C 16/3495
 See application file for complete search history.

(56) References Cited

U.S. PATENT DOCUMENTS

| | | | |
|---|---|---|---|
| 2016/0179617 A1* | 6/2016 | Lee ..................... | G06F 11/1048 |
| | | | 714/755 |
| 2019/0096487 A1* | 3/2019 | Nishikawa ............. | G11C 29/42 |
| 2020/0202938 A1* | 6/2020 | Reina .................. | G06F 11/0727 |
| 2022/0328112 A1* | 10/2022 | Yang ................... | G11C 11/5628 |
| 2023/0041476 A1* | 2/2023 | Yang ................... | G11C 16/3495 |
| 2023/0058038 A1* | 2/2023 | Zainuddin ............ | G11C 16/349 |

* cited by examiner

*Primary Examiner* — Sultana Begum
*Assistant Examiner* — Elizabeth Rose Agger
(74) *Attorney, Agent, or Firm* — Crowell & Moring LLP

(57) ABSTRACT

A block of memory in a data storage device can be partitioned into two or more sub-blocks, where each sub-block is independent of the other sub-blocks. If the program-erase counts of the sub-blocks are sufficiently low, the same programming voltage can be used to program each of the sub-blocks. However, for higher program-erase counts, disturb effects can create issues in using the same programming voltage. With the embodiments presented herein, the programming voltage of a given sub-block can be based on the program-erase count of the sub-block. This can avoid the need to compare program-erase counts of various sub-blocks and perform a relocation operation.

19 Claims, 6 Drawing Sheets

Sub-Block A

Sub-Block B

BLOCK

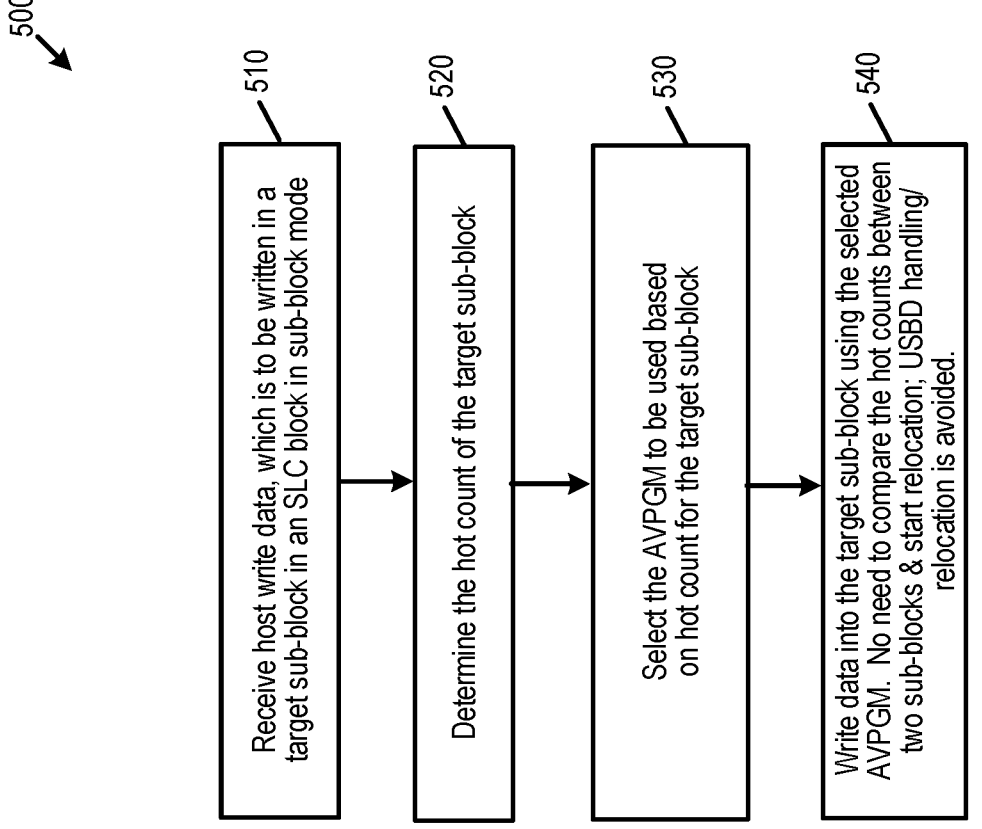

Receive host write data, which is to be written in a target sub-block in an SLC block in sub-block mode Determine the hot count of the target sub-block Select the AVPGM to be used based on hot count for the target sub-block Write data into the target sub-block using the selected AVPGM. No need to compare the hot counts between two sub-blocks & start relocation; USBD handling/ relocation is avoided.

FIG. 5

DATA STORAGE DEVICE AND METHOD FOR MANAGING A HOT COUNT DIFFERENCE IN SUB-BLOCK MODE

BACKGROUND

A memory in a data storage device can comprise a plurality of blocks of memory cells. An adaptive programming voltage mechanism can be used in which different programming voltages are used in different blocks. In some data storage devices, a block of memory can be partitioned into two or more sub-blocks, where each sub-block is independent of the other sub-blocks, and all of the sub-blocks receive the same programming voltage.

BRIEF DESCRIPTION OF THE DRAWINGS

FIG. 4 is a diagram of a block of memory of an embodiment partitioned into two sub-blocks.

FIG. 5 is a flow chart of a method of an embodiment for managing a hot count difference in a sub-block mode operation.

DETAILED DESCRIPTION

The following embodiments generally relate to a data storage device and method for managing a hot count difference in sub-block mode. In one embodiment, a data storage device is provided comprising a memory and one or more processors. The memory comprises a block configured to be partitioned into two or more sub-blocks. The one or more processors, individually or in combination, are configured to: determine a program-erase count of a sub-block of the two or more sub-blocks; determine a programing voltage for the sub-block based on the program-erase count of the sub-block; and program the sub-block using the programming voltage.

In another embodiment, a method is performed in a data storage device comprising a memory comprising a block that comprises a plurality of sub-blocks. The method comprises: determining a hot count of a target sub-block; changing an adaptive programing voltage to a level associated with the determined hot count; and programming the target sub-block using the changed adaptive programming voltage.

In yet another embodiment, a data storage device is provided comprising: a memory; and means for operating in a sub-block mode, in which each sub-block of a block of memory is programmed using a programming voltage associated with a program-erase count of the sub-block.

Other embodiments are possible, and each of the embodiments can be used alone or together in combination. Accordingly, various embodiments will now be described with reference to the attached drawings.

Embodiments

The following embodiments relate to a data storage device (DSD). As used herein, a "data storage device" refers to a non-volatile device that stores data. Examples of DSDs include, but are not limited to, hard disk drives (HDDs), solid state drives (SSDs), tape drives, hybrid drives, etc. Details of example DSDs are provided below.

Figures 1A, 1B, 1C:
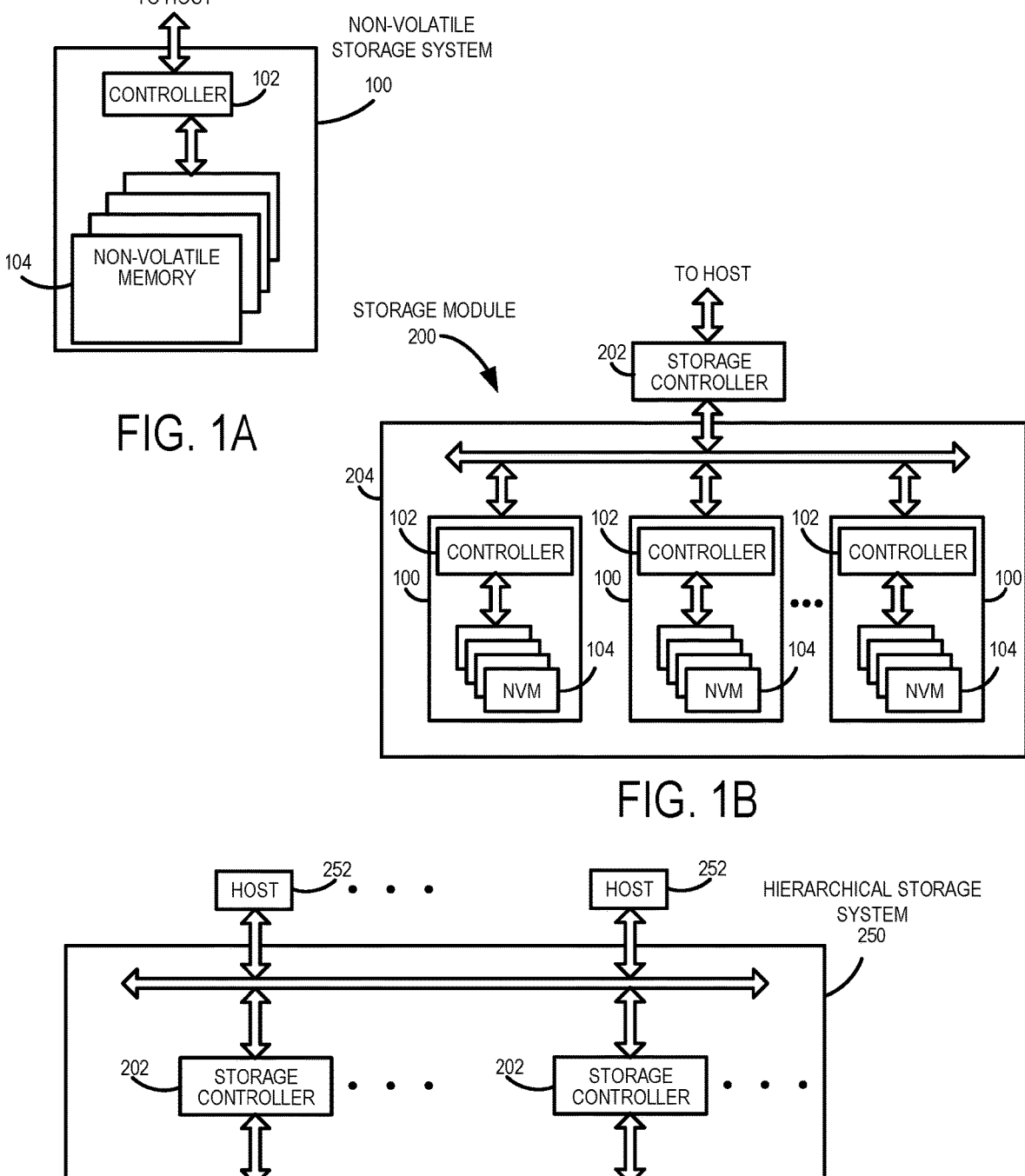
FIG. 1A is a block diagram of a data storage device of an embodiment.
FIG. 1B is a block diagram illustrating a storage module of an embodiment.
FIG. 1C is a block diagram illustrating a hierarchical storage system of an embodiment.

Examples of data storage devices suitable for use in implementing aspects of these embodiments are shown in FIGS. 1A-1C. It should be noted that these are merely examples and that other implementations can be used. FIG. 1A is a block diagram illustrating the data storage device 100 according to an embodiment. Referring to FIG. 1A, the data storage device 100 in this example includes a controller 102 coupled with a non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. The controller 102 interfaces with a host system and transmits command sequences for read, program, and erase operations to non-volatile memory die 104. Also, as used herein, the phrase "in communication with" or "coupled with" could mean directly in communication/coupled with or indirectly in communication/coupled with through one or more components, which may or may not be shown or described herein. The communication/coupling can be wired or wireless.

Figure 2A:
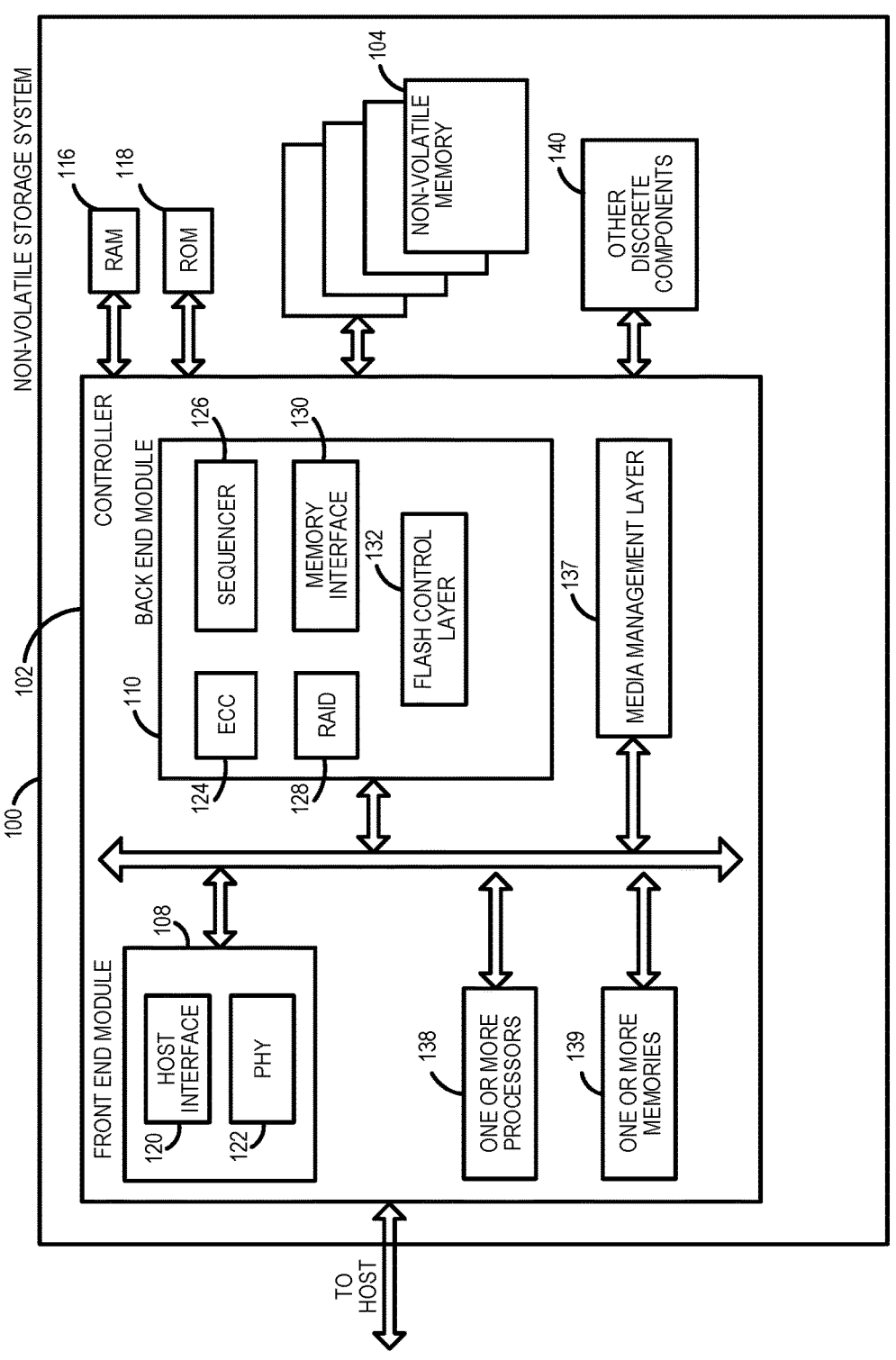
FIG. 2A is a block diagram illustrating components of the controller of the data storage device illustrated in FIG. 1A according to an embodiment.

The controller 102 (which may be a non-volatile memory controller (e.g., a flash, resistive random-access memory (ReRAM), phase-change memory (PCM), or magnetoresistive random-access memory (MRAM) controller)) can include one or more components, individually or in combination, configured to perform certain functions, including, but not limited to, the functions described herein and illustrated in the flow charts. For example, as shown in FIG. 2A, the controller 102 can comprise one or more processors 138 that are, individually or in combination, configured to perform functions, such as, but not limited to the functions described herein and illustrated in the flow charts, by executing computer-readable program code stored in one or more non-transitory memories 139 inside the controller 102 and/or outside the controller 102 (e.g., in random access memory (RAM) 116 or read-only memory (ROM) 118). As another example, the one or more components can include circuitry, such as, but not limited to, logic gates, switches, an application specific integrated circuit (ASIC), a programmable logic controller, and an embedded microcontroller.

In one example embodiment, the non-volatile memory controller 102 is a device that manages data stored on non-volatile memory and communicates with a host, such as a computer or electronic device, with any suitable operating system. The non-volatile memory controller 102 can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware (and/or other metadata used for housekeeping and tracking) to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC) (e.g., dual-level cells, triple-level cells (TLC), quad-level cells (QLC), etc.) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, the data storage device 100 may be a card-based system, such as a secure digital (SD) or a micro secure digital (micro-SD) card. In an alternate embodiment, the data storage device 100 may be part of an embedded data storage device.

Although, in the example illustrated in FIG. 1A, the data storage device 100 (sometimes referred to herein as a storage module) includes a single channel between controller 102 and non-volatile memory die 104, the subject matter described herein is not limited to having a single memory channel. For example, in some architectures (such as the ones shown in FIGS. 1B and 1C), two, four, eight or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile data storage devices 100. As such, storage module 200 may include a storage controller 202 that interfaces with a host and with data storage device 204, which includes a plurality of data storage devices 100. The interface between storage controller 202 and data storage devices 100 may be a bus interface, such as a serial advanced technology attachment (SATA), peripheral component interconnect express (PCIe) interface, double-data-rate (DDR) interface, or serial attached small scale compute interface (SAS/SCSI). Storage module 200, in one embodiment, may be a solid-state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective data storage device 204. Host systems 252 may access memories within the storage system 250 via a bus interface. In one embodiment, the bus interface may be a Non-Volatile Memory Express (NVMe) or Fibre Channel over Ethernet (FCOE) interface. In one embodiment, the system illustrated in FIG. 1C may be a rack mountable mass storage system that is accessible by multiple host computers, such as would be found in a data center or other location where mass storage is needed.

Referring again to FIG. 2A, the controller 102 in this example also includes a front-end module 108 that interfaces with a host, a back-end module 110 that interfaces with the one or more non-volatile memory die 104, and various other components or modules, such as, but not limited to, a buffer manager/bus controller module that manage buffers in RAM 116 and controls the internal bus arbitration of controller 102. A module can include one or more processors or components, as discussed above. The ROM 118 can store system boot code. Although illustrated in FIG. 2A as located separately from the controller 102, in other embodiments one or both of the RAM 116 and ROM 118 may be located within the controller 102. In yet other embodiments, portions of RAM 116 and ROM 118 may be located both within the controller 102 and outside the controller 102.

Front-end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back-end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. The controller 102 in this example also comprises a media management layer 137 and a flash control layer 132, which controls the overall operation of back-end module 110.

The data storage device 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
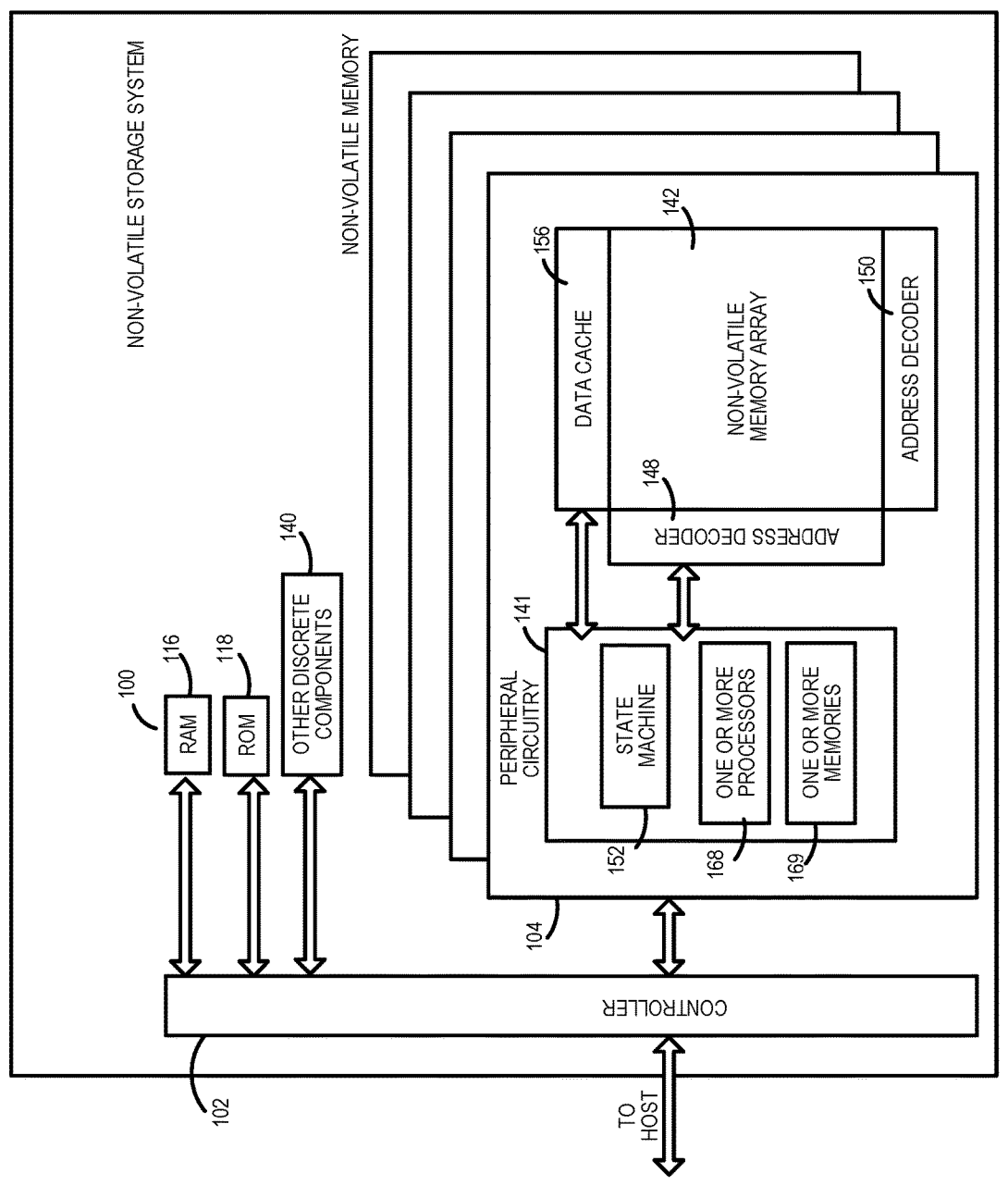
FIG. 2B is a block diagram illustrating components of the data storage device illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two-dimensional and/or three-dimensional configuration. Non-volatile memory die 104 further includes a data cache 156 that caches data. The peripheral circuitry 141 in this example includes a state machine 152 that provides status information to the controller 102. The peripheral circuitry 141 can also comprise one or more components that are, individually or in combination, configured to perform certain functions, including, but not limited to, the functions described herein and illustrated in the flow charts. For example, as shown in FIG. 2B, the memory die 104 can comprise one or more processors 168 that are, individually or in combination, configured to execute computer-readable program code stored in one or more non-transitory memories 169, stored in the memory array 142, or stored outside the memory die 104. As another example, the one or more components can include circuitry, such as, but not limited to, logic gates, switches, an application specific integrated circuit (ASIC), a programmable logic controller, and an embedded microcontroller.

In addition to or instead of the one or more processors 138 (or, more generally, components) in the controller 102 and the one or more processors 168 (or, more generally, components) in the memory die 104, the data storage device 100 can comprise another set of one or more processors (or, more generally, components). In general, wherever they are located and however many there are, one or more processors (or, more generally, components) in the data storage device 100 can be, individually or in combination, configured to perform various functions, including, but not limited to, the functions described herein and illustrated in the flow charts. For example, the one or more processors (or components) can be in the controller 102, memory device 104, and/or other location in the data storage device 100. Also, different functions can be performed using different processors (or components) or combinations of processors (or components). Further, means for performing a function can be implemented with a controller comprising one or more components (e.g., processors or the other components described above).

Returning again to FIG. 2A, the flash control layer 132 (which will be referred to herein as the flash translation layer (FTL) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may be written in only multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
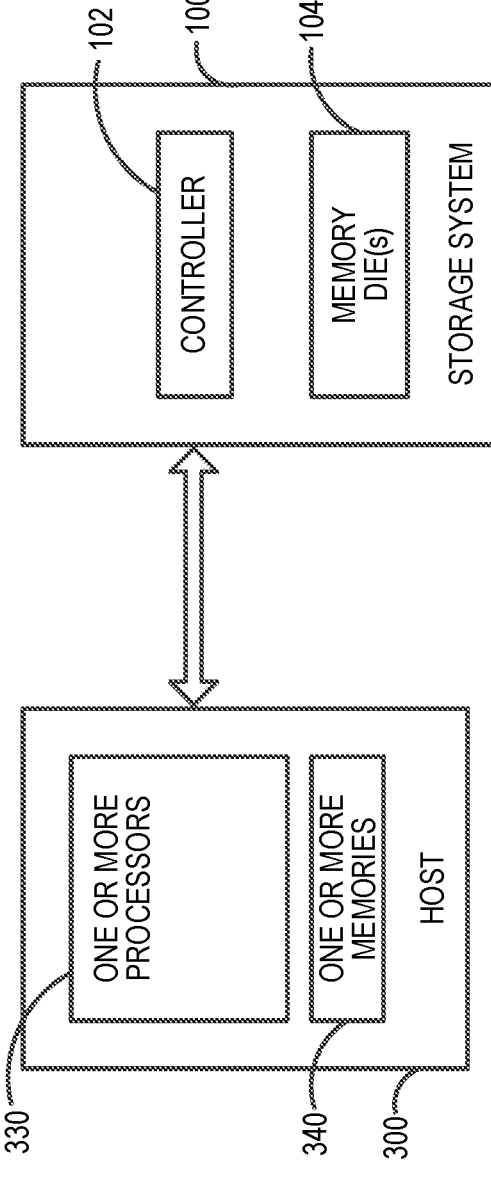
FIG. 3 is a block diagram of a host and a data storage device of an embodiment.

Turning again to the drawings, FIG. 3 is a block diagram of a host 300 and data storage device 100 of an embodiment. The host 300 can take any suitable form, including, but not limited to, a computer, a mobile phone, a tablet, a wearable device, a digital video recorder, a surveillance system, etc.

The host 300 in this embodiment (here, a computing device) comprises one or more processors 330 and one or more memories 340. In one embodiment, computer-readable program code stored in the one or more memories 340 configures the one or more processors 330 to perform the acts described herein as being performed by the host 300. So, actions performed by the host 300 are sometimes referred to herein as being performed by an application (computer-readable program code) run on the host 300. For example, the host 300 can be configured to send data (e.g., initially stored in the host's memory 340) to the data storage device 100 for storage in the data storage device's memory 104.

Figure 4:
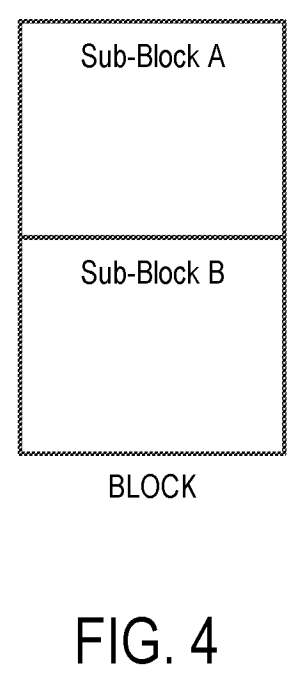

In one embodiment, the memory 104, which can include one or more memory dies, comprises a plurality of blocks of memory. In an embodiment that uses a three-dimensional memory, a block of memory can comprise a plurality of memory cells located in a single x-y location on a silicon die but in a plurality of z locations. A block of memory can be partitioned (e.g., by the controller 102) into a plurality of sub-blocks, where each sub-block of the plurality of sub-blocks occupies the single x-y location but is located in a different z location. In a BiCS architecture, the plurality of sub-blocks (sometimes referred to as "tiers" or "partial blocks") can be connected vertically to the same memory hole. Each sub-block in a block can have its own wordline zone. FIG. 4 is an illustration of an example block partitioned into two sub-blocks.

The data storage device 100 can be referred to as operating in "sub-block mode (SBM)" when a block is partitioned into two or more sub-blocks. In sub-block mode, each of the sub-blocks is completely independent of the other sub-blocks in the block. Sub-block mode has its own advantages but also comes with its own unique sets of challenges. One challenge is referred to as an unselected sub-block disturb (USBD), which refers to error created by a voltage shift in one sub-block after another sub-block has been programmed and erased more than a threshold number of times (e.g., program-erase cycles). For a relatively-low number of program-erase cycles (e.g., 5,000 or 10,000) to a single-level cell (SLC) block, the same programming voltage can be used with all of the sub-blocks. However, with aggressive trim development, some memory can support a much-larger number of program-erase cycles (e.g., 100, 000). So, different sub-blocks may require different programming voltages (e.g., by reducing the programming voltage by one digital-to-analog conversion ("DAC") shift after every 10,000 program-erase cycles).

For example, while one block is being cycled for 100,000, other blocks can retain their data all through the 100,000 cycles and still meet the reliability specifications. With such high USBD specifications, sub-block disturb implementation can become seamless for the data storage device 100 just by changing the sub-block disturb command sequences. However, the number of program-erase cycles (which is sometimes referred to herein as the "hot count") of the various sub-blocks can be very different and may need different programming voltages (VPGM). For example, if one sub-block has a hot count of 10,000, while another sub-block has a hot count of 100,000, the two sub-blocks may need different programming voltages (VPGM) with different DAC shifts.

That is, with lower USBD specifications (e.g., with a 10,000 program-erase count), the hot count difference between the two sub-blocks may not be relevant. However, with higher USBD specifications (e.g., with a 100,000 program-erase count), adaptive VPGM handling across sub-blocks can provide several advantages. For example, these embodiments can avoid back-to-back relocation, which helps reduce garbage collection and improve write amplification. Additionally, with the controller 102 (e.g., firmware) managing adaptive VPGM separately for each sub-block, higher USBD specifications can be achieved. With these embodiments, the controller 102 can also handle a frequently-occurring defect scenario due to USBD, support greater block read disturb, and support other use case scenarios.

To provide adaptive programming voltage (AVPGM) based on the hot count differences of the sub-blocks, the controller 102 can implement an algorithm to monitor hot count difference between sub-blocks and use an adaptive program voltage methodology to identify the appropriate programming voltage for a given sub-block. It should be noted that while adaptive VPGM can be used for normal block operations, these embodiments are focused on adaptive VPGM but its implementation for sub-blocks. That is, adaptive VPGM already exists in different forms for full-block operation, but with recent device development, the usefulness of adaptive VPGM can be extended to sub-block operation as well.

FIG. 5 is a flow chart 500 of a method of an embodiment for managing a hot count difference in a sub-block mode operation. As shown in FIG. 5, the data storage device 100 receives write data from the host 300, which is to be written in a target sub-block in an SLC block using a sub-block mode (act 510). The controller 102 of the data storage device 100 then determines the hot count of the target sub-block (act 520) and selects the adaptive programming voltage (AVPGM) to be used based on the hot count for the target sub-block (act 530). For example, the data storage device 100 can store a data structure (e.g., one or more lists) that associates a plurality of hot counts with a plurality of programming voltages. Next, the controller 102 writes the data in the target sub-block using the selected programming voltage (act 540). With this embodiment, there is no need to compare the hot counts between two sub-blocks and start relocation. Thus, USBD handling/relocation is avoided.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements in each column. The columns may be arranged in a two-dimensional configuration, e.g., in an x-z plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three-dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A data storage device comprising:
a memory comprising a block configured to be partitioned into two or more sub-blocks; and
one or more processors, individually or in combination, configured to:
determine whether a program-erase count of each sub-block exceeds a threshold;
in response to determining that the program-erase count of each sub-block does not exceed the threshold, use a same programming voltage to program each sub-block; and
in response to determining that the program-erase count of each sub-block exceeds the threshold, use an adaptive programming voltage to program each sub-block by, for each sub-block;

determining a program-erase count of the sub-block;
determining a programming voltage for the sub-block based on the program-erase count of the sub-block; and
programming the sub-block using the programming voltage determined for the sub-block.

2. The data storage device of claim 1, wherein the programming voltage for the sub-block is determined from a data structure that associates a plurality of program-erase counts with a respective plurality of programming voltages.

3. The data storage device of claim 1, wherein the one or more processors, individually or in combination, are further configured to avoid both comparing program-erase counts between two sub-blocks of the two or more sub-blocks and performing unselected-sub-block-disturb (USBD) relocation handling.

4. The data storage device of claim 1, wherein the one or more processors, individually or in combination, are further configured to partition the block of memory into the two or more sub-blocks.

5. The data storage device of claim 1, wherein each sub-block of the two or more sub-blocks occupies a single x-y location but is located in a different z location.

6. The data storage device of claim 1, wherein each sub-block of the two or more sub-blocks is connected vertically to a same memory hole.

7. The data storage device of claim 1, wherein each sub-block of the two or more sub-blocks comprises its own wordline zone.

8. The data storage device of claim 1, wherein each sub-block of the two or more sub-blocks operates independently of other sub-blocks of the two or more sub-blocks.

9. The data storage device of claim 1, wherein the block is a single-level cell (SLC) block.

10. The data storage device of claim 1, wherein the memory comprises a three-dimensional memory.

11. In a data storage device comprising a memory comprising a block that comprises two or more sub-blocks, a method comprising:
determining whether a hot count of each sub-block exceeds a threshold;
in response to determining that the hot count of each sub-block does not exceed the threshold, using a same programming voltage to program each sub-block; and
in response to determining that the hot count of each sub-block exceeds the threshold, using an adaptive programming voltage to program each sub-block by, for each sub-block:
determining a hot count of the sub-block;
determining a changing an adaptive programming programing voltage to a level for the sub-block based on the hot count of the sub-block; and
programming the sub-block using the programming voltage determined for the sub-block.

12. The method of claim 11, wherein a data structure stores an association of programming voltages and hot counts.

13. The method of claim 11, further comprising avoiding both comparing hot counts between two sub-blocks of the two or more sub-blocks and performing unselected-sub-block-disturb (USBD) relocation handling.

14. The method of claim 11, wherein each sub-block of the two or more sub-blocks occupies a single x-y location but is located in a different z location.

15. The method of claim 11, wherein each sub-block of the two or more sub-blocks is connected vertically to a same memory hole.

16. The method of claim 11, wherein each sub-block of the two or more sub-blocks comprises its own wordline zone.

17. The method of claim 11, wherein each sub-block of the two or more sub-blocks operates independently of other sub-blocks of the two or more sub-blocks.

18. The method of claim 11, wherein the memory comprises a three-dimensional memory.

19. A data storage device comprising:

a memory comprising a plurality of sub-blocks; and means for:

determining whether a program-erase count of each sub-block exceeds a threshold;

in response to determining that the program-erase count of each sub-block does not exceed the threshold, using a same programming voltage to program each sub-block; and in response to determining that the program-erase count of each sub-block exceeds the threshold, using an adaptive programming voltage to program each sub-block by, for each sub-block:

determining a program-erase count of the sub-block;

determining a programming voltage for the sub-block based on the program-erase count of the sub-block; and programming the sub-block using the programming voltage determined for the sub-block.

\* \* \* \* \*